United States Patent [19]

Nelson

[11] Patent Number: 4,864,343
[45] Date of Patent: Sep. 5, 1989

[54] PRESSURE DEVELOPMENT ROLL FOR IMAGING SHEETS EMPLOYING PHOTOSENSITIVE MICROCAPSULES

[75] Inventor: Erik K. Nelson, Centerville, Ohio

[73] Assignee: The Mead Corporation, Dayton, Ohio

[21] Appl. No.: 166,086

[22] Filed: Mar. 9, 1988

[51] Int. Cl.$^4$ ............................ G03N 9/02; G03C 1/72
[52] U.S. Cl. ...................................... 354/304; 355/27;
100/162 B; 29/130; 29/132
[58] Field of Search .................. 354/86, 297, 304;
355/27; 100/162 B, 158 R; 29/130, 132, 116.2,
113.2

[56] References Cited

U.S. PATENT DOCUMENTS

| | | | |
|---|---|---|---|
| 3,522,643 | 8/1970 | Winkler | 29/130 |
| 3,750,246 | 8/1973 | Pessen | 29/113.2 |
| 4,343,234 | 8/1982 | Sasaki | 100/158 R |
| 4,372,247 | 2/1983 | Calabrese | 29/130 |
| 4,399,209 | 8/1983 | Sanders et al. | 430/217 |
| 4,440,846 | 4/1984 | Sanders et al. | 430/138 |
| 4,578,340 | 3/1986 | Saccocio et al. | 354/297 |
| 4,727,392 | 2/1988 | Stone et al. | 354/304 |
| 4,768,050 | 8/1988 | Beery | 355/27 |

FOREIGN PATENT DOCUMENTS 795523  5/1958  United Kingdom .................. 29/130

*Primary Examiner*—A. A. Mathews
*Attorney, Agent, or Firm*—Thomas A. Boshinski

[57] ABSTRACT

A pressure roll is disclosed particularly for fixing and developing sheet material which is treated by passing through a high pressure nip defined by a pair of the rolls. The roll includes a support shaft and a cylindrical roll body secured to the shaft. To produce a uniform force along the pressure nip when a pair of the rolls are placed under load, the body is formed from a body material having a modulus of elasticity which varies as a function of position along the length of said body. The body is encased in a cylindrical shell.

5 Claims, 4 Drawing Sheets

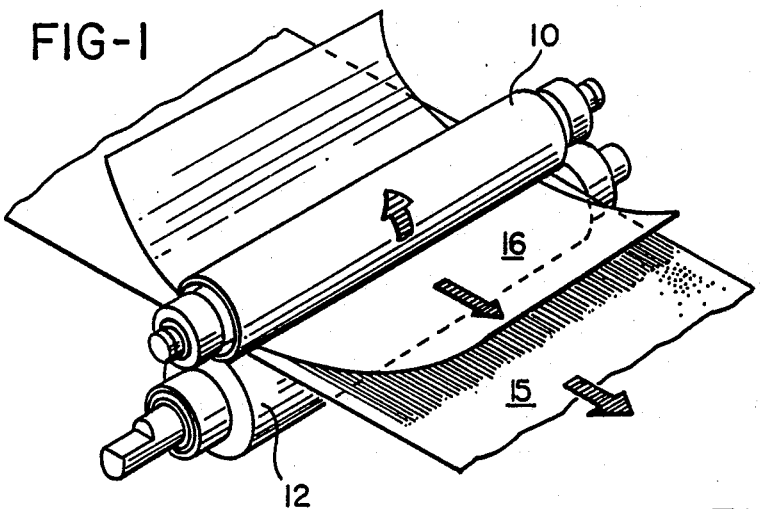
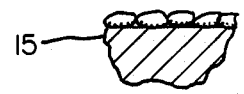
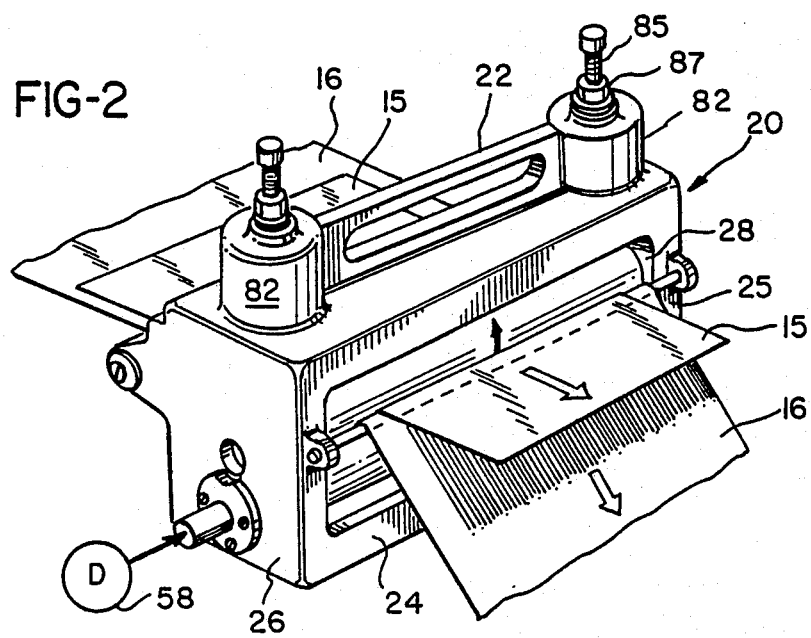

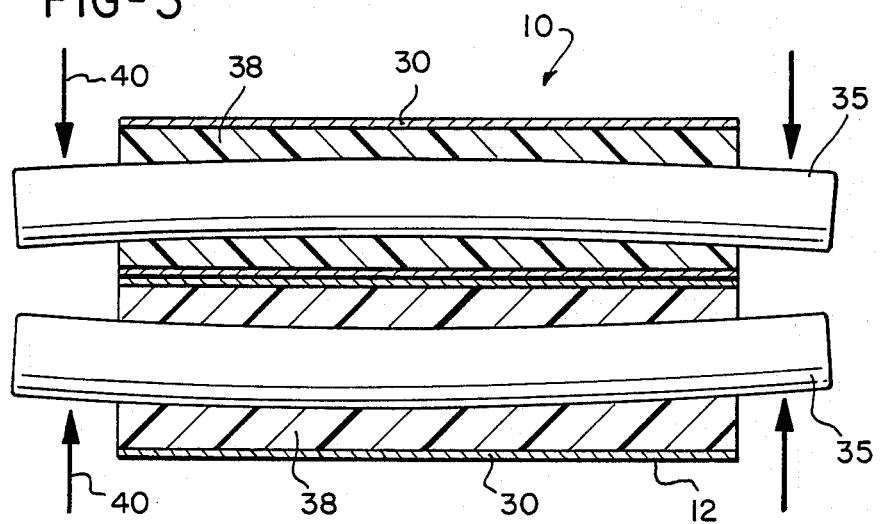
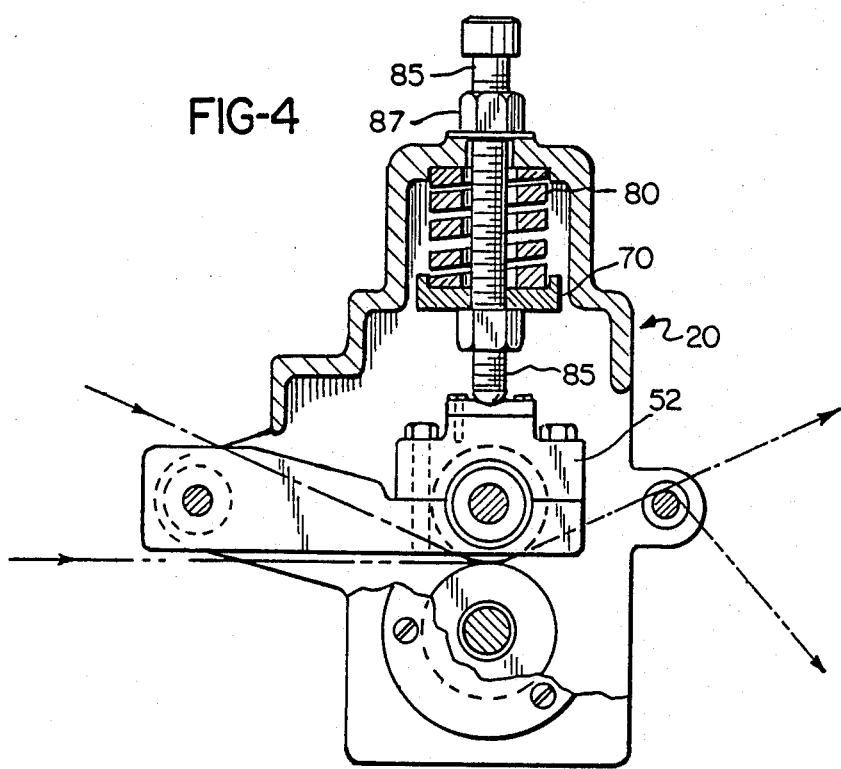

$Px = k_x y$

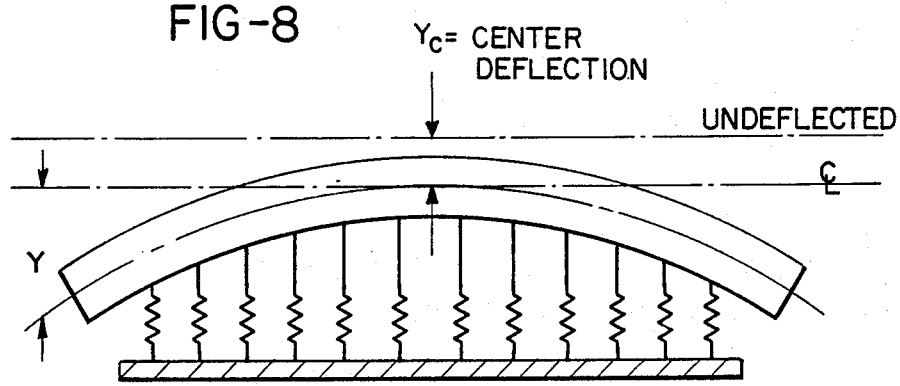
FIG-8  $Y_c$ = CENTER DEFLECTION
UNDEFLECTED
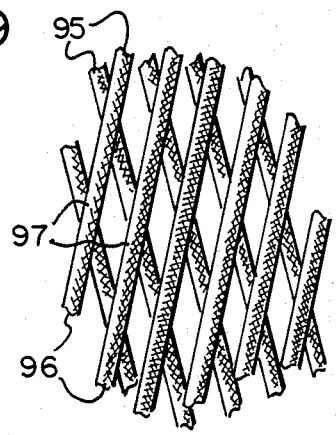
FIG-9

PRESSURE DEVELOPMENT ROLL FOR IMAGING SHEETS EMPLOYING PHOTOSENSITIVE MICROCAPSULES

BACKGROUND OF THE INVENTION

The present invention relates generally to pressure rolls for pressure treating sheets, and more particularly to a roll which is suitable for use with an imaging system utilizing imaging sheets having a surface coating of rupturable photosensitive microcapsules. The pressure roll may be used within apparatus for rupturing the microcapsules on such imaging sheets to produce an image.

U.S. Pat. Nos. 4,440,846 and 4,399,209, which are assigned to the same assignee as this invention, and which are hereby incorporated by reference, describe an imaging system wherein a photosensitive layer, comprising microcapsules containing a photosensitive composition in the internal phase, is imagewise exposed to actinic radiation and subjected to a uniform rupturing force whereupon the microcapsules rupture and imagewise release the internal phase. The imaging system is particularly advantageous because it is a totally dry system and does not rely upon the application of wet developing processing solutions to produce the image. An image forming chromogenic material, such as a substantially colorless color form, is typically associated with the microcapsules. When the microcapsules rupture, the color former imagewise reacts with the developer material and produces a color image. In the embodiments described in the referenced patents, the microcapsules are typically ruptured by passing imagewise exposed imaging sheets through the nip between a pair of parallel calender rolls.

The media may exist in either single sheet or two sheet versions. In the former case, the microcapsules and developer composition are both coated onto a single substrate layer. In the later case, the microcapsules are carried on a first substrate layer referred to as a donor sheet. The developer composition is coated onto a second, separate substrate layer referred to as a receiver sheet. The donor sheet is subjected to the actinic radiation, and the exposed microcapsule layer is then brought into contact with the developer layer of the receiver sheet. In either case, the image is developed by pressure, with the finished image being formed in the sheet carrying the developer layer.

While heavy pressure is not required to rupture the microcapsules, high pressure is normally used to develop the imaging sheets. To normalize surface irregularities in the imaging sheets, substantial compression of the paper must be achieved. Otherwise, if the rupturing force is not uniformly distributed, the imaging sheets develop unevenly and the tonal characteristics of the resulting images are degraded. Thus, typical developing pressures of 6,000 to 8,000 psi are required.

Unless very large diameter rolls are used for development, it is difficult to achieve uniform high pressure across the width of a nip between a pair of simple developer rolls. The rolls can be loaded only at their ends, and the pressure exerted upon a sheet passing between the nip of the rolls will be greater towards the roll ends and at a minimum value at the nip center point.

To overcome these difficulties in the art of fixing fusible toner images, it is known to use a pair of rolls biased toward each other and disposed such that the axis of one roll extends at an angle relative to the axis of the other. This skewed arrangement tends to minimize irregularities of the nip between the rolls and to ensure uniform pressure along the nip despite bending of the rolls. However, when the skew angle is sufficiently large to overcome roll bending, creases or wrinkles may be formed in a paper sheet passing between the nip.

Yet another approach is shown in U.S. Pat. No. 4,343,234, in which a three-roll system includes a pair of pinch rolls disposed with a slight skew angle therebetween, and a third back-up roll disposed in a crossing contact relative to one of the pinch rolls. The back-up roll is biased resiliently upwards towards the second roll of the pair of pinch rolls by a pressure mechanism such that the second roll is butted against the first roll under pressure to form a nip through which paper sheets pass. The bending of the second roll can be adjusted by the cross angle of the back-up roll relative to the second roll such that both the second roll and the back-up roll may have a smaller diameter than the first roll. Even in this case, however, the skew angle between the nip rolls must still be relatively small to avoid wrinkling of the sheets.

A particular inherent disadvantage of such prior art pressure systems is that the pressure across the nip is uniform only at one designed pressure, and variations in the thickness of the material passing through the nip or variations in the pressure applied to the nip causes a departure from a condition of pressure linearity across the nip.

An alternate approach to the problem of bending rolls can be seen in U.S. Pat. No. 4,581,797. A pair of pressure rolls includes one conventional roll, and a second roll formed from a sleeve rotatably mounted on a shaft. A plurality of support elements extend between the roll shaft and the inner surface of the roll sleeve. Fluid under pressure is applied to each of the support elements to compensate for the bending of the support shaft and to produce a linear nip along which uniform pressure is applied. Each of the support elements can be individually controlled to permit relatively accurate adjustment. However, the disclosed device requires a relatively complex mechanical and fluid distribution structure, and is not particularly well suited for use in small diameter pressure rolls such as might be used in an apparatus for pressure development of paper sheets.

What is needed, therefore, is an apparatus which is relatively light in weight, can be easily constructed to be relatively small of size, and which is capable of providing a substantially uniform nip pressure throughout a design width of the roll over varying thicknesses of sheet material and over varying overall loadings on the rolls. Such an apparatus should be inherently capable of applying a uniform pressure across a nip, over long periods of time, and with a minimum of maintenance requirements.

SUMMARY OF THE INVENTION

In meeting the foregoing needs, the present invention provides a roll-type pressure fixing and developing apparatus in which sheet material to be treated is passed through a high pressure nip defined by a pair of rolls carried in a frame. The frame mounts the first roll for pressure engagement with the second roll for defining the nip, and the frame is provided with loading means for applying load to the first roll.

Each of the rolls includes a support shaft and a cylindrical roll body secured to the shaft. The body has a length and defines a center point on the body and first and second ends spaced equidistantly in opposite directions from the center point. The body is formed from a body material having a modulus of elasticity which varies as a function of position along the length of the body.

The body is encased in a cylindrical shell, preferably a shell formed from a hardened metallic material.

The modulus of elasticity of the body material varies from a minimum value at the first and second ends of the body to a maximum value at the center of the body.

As a result of this construction, and as load is applied to the rolls at the ends of their respective shafts, each shaft will bend such that the shafts are more closely spaced at their ends than at the roll centers. However, the body material, rather than bending with the shafts as in conventional rolls, is compressed by the shaft load to an extent which is determined by the modulus of elasticity of the body material. With the modulus having a minimum value at the roll ends, these portions are compressed most and the force applied to the nip along these portions of the roll is equal to the center portion of the roll where the modulus is at a maximum value. By properly selecting the modulus along the roll length, the force applied along the nip can be made uniform or, if desired, nonuniform in a predetermined fashion.

The body material may be any material within which the modulus of elasticity can be varied and controlled, but is preferably formed from graphite filaments woven to have a predetermined wrap angle, the modulus of elasticity of the body material being a function of the wrap angle.

Accordingly, it is an object of the present invention to provide an apparatus for the pressure treatment of sheet material; to provide such an apparatus which is comprised of a pair of pressure rolls arranged to define a pressure nip between which the sheet material is passed; to provide such an apparatus which is relatively light in weight, can be easily constructed to be relatively small of size, and which is capable of providing a substantially uniform nip pressure throughout a design width of the roll over varying thicknesses of sheet material and over varying overall loadings on the rolls; and to provide such an apparatus which includes pressure rolls achieving these objectives such that the rolls may be substituted into already existing apparatus while producing the advantages of the present invention.

Other objects and advantages of the present invention will be apparent from the following description, the accompanying drawings, and the appended claims.

BRIEF DESCRIPTION OF THE DRAWINGS

FIG. 1 is a perspective view showing a pair of rolls constructed in accordance with the present invention showing sheet material applied therebetween;

FIG. 1A is a magnified portion of the donor sheet of FIG. 1, showing the microcapsules coated thereon;

FIG. 2 is a perspective view of a two-roll pressure developer incorporating the roll pair;

FIG. 3 is an elevated view of the roll pair showing the rolls in section;

FIG. 4 is an enlarged partially broken away end view of the apparatus of FIG. 2;

FIGS. 5-8 are diagrammatic views illustrating a mathematical model for analyzing a roll constructed in accordance with the present invention; and FIG. 9 is an enlarged diagrammatic view showing two layers of filaments from which the roll pair may be constructed.

DETAILED DESCRIPTION OF THE PREFERRED EMBODIMENT

Figure 5:
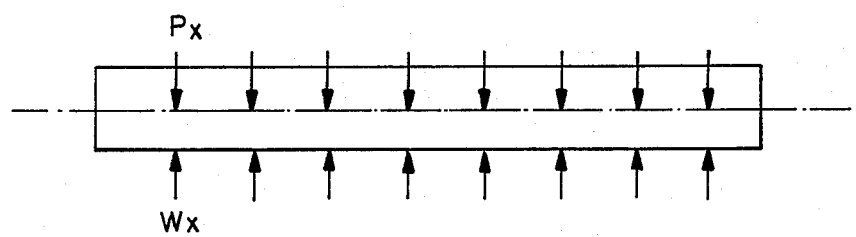

Referring now to the drawings, FIGS. 1 and 2 illustrate a two-roll pressure type developer within which rolls in accordance with the present invention may be used. The developer apparatus includes a first roll 10 and a second roll 12 mounted in parallel to each other to define a nip for receiving sheet material therebetween. The sheet material may consist of a single sheet, but as is illustrated in FIG. 1, preferably consists of a donor sheet 15 and a receiver sheet 16 made in accordance of the teachings of U.S. Pat. No. 4,399,209. In accordance with the teachings of that patent, images are formed by exposing a coated composition containing a chromogenic material and the encapsulated photosensitive composition to actinic radiation. Thereafter, the capsules, shown in FIG. 1A, are ruptured in the presence of a developer carried on the receiver sheet. The capsules are ruptured by the application of a high uniform pressure in the nip between the pair of rolls 10 and 12, as more fully explained in U.S. Pat. No. 4,727,392.

Due to the high linear unit forces involved, it is important that the roll-type developer operate without differential slippage at the nip which could tend to cause the web to wrinkle. It is also important that the pressure be developed uniformly throughout a working zone of the nip. Otherwise, the capsules may not rupture uniformly, producing nonuniform quality in the finished image.

The pressure developing rolls 10 and 12 are mounted for rotation in a frame or housing illustrated generally at 20 in FIG. 2. The housing structure may, advantageously, be provided with a top 22, a bottom 24, and a pair of spaced-apart side frame members 25 and 26. The housing 20 includes a central opening 28 therethrough for passage of the sheets.

The pressure rolls 10 and 12 in accordance with the present invention can be seen by reference to FIG. 3. Each roll includes a cylindrical outer shell 30 formed from a hardened material such as stainless steel. A loading shaft 35 extends through each roll. The main body portion of the roll between outer shell 30 and shaft 35 is comprised by a body material 38 which will be described in detail below. Loading is applied to each shaft 35 as indicated generally by arrows 40. The load is applied as the rolls are mounted in the housing 20 parallel to each other. The remote ends of each shaft 35 extend beyond the roll body and define bearing surfaces which receive appropriate bearings. Roll 12 is secured in position within appropriate bearings to side frames 26 and 28 of housing 20, and the system drive 58 is coupled to shaft 35 of roll 12.

As shown in FIG. 4, rolls 10 and 12 may be loaded by loading on journals 52 within which shaft 35 of roll 10 is supported. Loading springs 80 are positioned within spring housing portions 82 of the housing 20 and bear against a thrust collar 83. The force of the spring 80 is transmitted by the collar to a threaded pressure rod 85, the lower end of which is in pressure engagement with a hardened upper surface of journal 52. The upper end of the rod 85 extends above the spring housing portion 82, and is adjustable on a nut 87 for varying the effective length of the rod 85. While the mounting and loading arrangement is shown for one end of the roll 10, it is understood that a substantially identical arrangement is provided for the other end of the roll.

It should also be recognized that the construction of housing 20 is by way of example only, and that any appropriate support structure for the pressure rolls capable of applying the necessary loading to the roll shafts may be used.

In describing the pressure rolls of the present invention, it is helpful to consider the bending of a pressure roll under a load applied to the shaft ends. For a conventional pressure roll, as well as for any beam, deflection of the centerline when loaded is defined by the well-known beam bending equation:

$$y = \int\int 1/E\, I\, M\, d^2x,$$

where E is the Young's modulus, I is the moment of inertia, M is the bending moment at the cross section, x is the linear position along the roll and y is the deflection at that position.

For a typical material, such as steel, the modulus of elasticity E is constant. For a conventional cylindrical roll, formed in a conventional manner, the cross-section of the beam defined by the equation is also constant, whereby the moment of inertia is constant, and the formula reduces to that published in standard handbooks.

For a conventional loaded pressure roll, at various positions x, deflection y necessarily varies as a function of x, thereby producing a non-uniform nip. The underlying principle of the present invention is that if the value of y along the nip can be made to equal zero, a uniform pressure will be applied along the nip. This can be achieved only if M is made to equal zero in the equation above.

If we consider the upper roll of a pressure roll pair as a simple beam, then the forces applied to the beam (which determine the bending moment M) include the downward loading force on the beam and the upward force exerted by the surface of the lower roll. For the present, we assume that the lower roll is not subject to bending, so that the upward force is uniform along the length of the beam. Referring to FIG. 5, bending moment M equals zero only when the forces acting on the beam are concurrent, i.e., when the upper force $p_x$ (from beam loading) and the lower force $w_x$ (from the lower roll surface) are equal ($p_x = w$).

Figure 6:
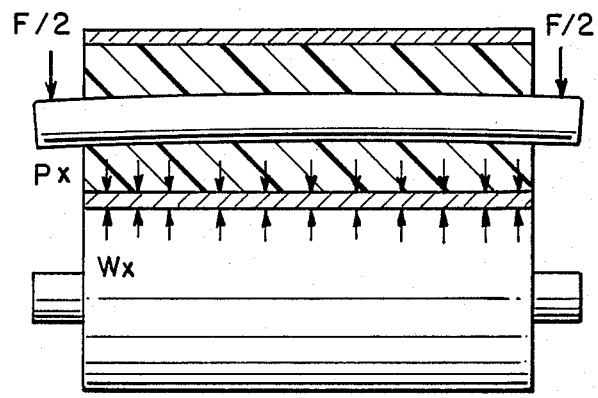

Consider now a hollow roll, corresponding to the cylindrical outer shell 30 of the roll of the present invention. The location of interest is the lowermost portion of the shell which, in contact with the lower roll, defines the pressure nip. The upper force $p_x$ is applied to the shell at its interior surface, see FIG. 6, while the lower force w is again applied by the lower pressure roll. For this shell to remain unbent ($y=0$), $p_x$ must remain constant along the entire length of the shell. Achieving this uniform load is the basic problem, however, since the interior supporting shaft will deflect because it must carry to entire load F at its ends.

Figure 7:
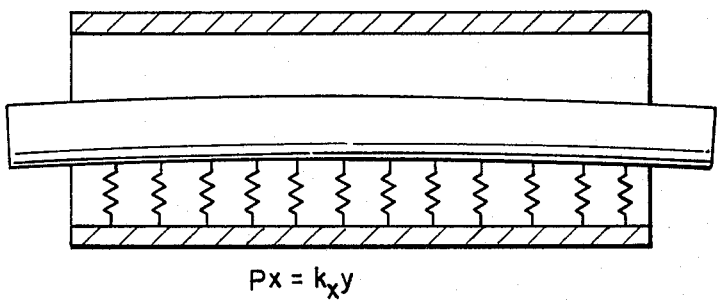

In the assembly of the shaft and the roller shell, the objective becomes to apply the load to the shaft ends and to have a flexible medium transform the end load into a uniformly applied continuous load on the shell interior surface. This can be achieved if we assume the flexible medium to comprise a plurality of springs connecting the shaft and roll shell interior, illustrated in FIG. 7, wherein the spring constant $k_x$ of the springs is made to vary along the length of the assembly. Of course, if the supporting medium is continuous, then an infinite number of springs exist along the length of the roll.

We can separately analyze the shaft, ignoring shear effects, by the beam bending equation, $$EI\frac{d^2y}{dx^2} = M = \frac{p}{2}(-Lx + x^2),$$

where the shaft is of a length L. Integrating this equation yields:

$$EI\frac{dy}{dx} = \frac{p}{2}\left(-\frac{Lx^2}{2} + \frac{x^3}{3}\right) + C_1$$

At $x = \frac{L}{2}$, $\frac{dy}{dx} = 0$, and therefore $C_1 = \frac{p}{2}\left(\frac{L^3}{12}\right)$.

Thus, $$EI\frac{dy}{dx} = \frac{p}{2}\left(-\frac{Lx^2}{2} + \frac{x^3}{3} + \frac{L^3}{12}\right).$$

Integrating again, $$EIy = \frac{p}{2}\left(-\frac{Lx^3}{6} + \frac{x^4}{12} + \frac{L^3x}{12}\right) + C_2.$$

Since $y=0$ at $x=0$, $C_2=0$, and $$EIy = \frac{px}{24}(x^3 - 2Lx^2 + L^3).$$

Note that the deflection y is calculated assuming simply supported ends, with a maximum value for y at the shaft center ($x = L/2$). Thus, $$y_{max} = \frac{5pL^4}{384\, EI}.$$

Turning again to the complete assembly, referring to FIG. 8, the relative deflection y between the shaft and the inner surface of the roll shell is $y = y_c + (Y_{max} - Y_{shaft})$, where $Y_c$ is the center deflection of the shaft from its undeflected position under no load. Since the local force p on the shell interior is $p = ky$, the spring constant of the intermediate material is $k = p/y$.

Accordingly, referring again to FIG. 3, the body material 38 positioned between the support shaft 35 and the steel sleeve 30 is formed from a composite material in which the compressibility or elastic modulus of the material varies along the length of the roll. One particularly appropriate material is formed by weaving a graphite fiber with a variable wrap angle, As is known in the art, the modulus of elasticity of such a woven material is determined by the wrap angle, and by varying the wrap angle along the length of the roll, the desired variable modulus is achieved. The greater the wrap angle with respect to the roll cross-section, the more compressible the composite material becomes, and the force applied to the outer shell of the roll can be equalized. The wrap angle should be at a maximum value at the roll ends, and at a minimum value at the roll center.

FIG. 9 shows an enlarged diagrammatic view of two layers of the filament windings of the preferred body material. Filaments 95 are shown wound onto the roll at an angle from right to left. Filaments 96 represent the next layer which is wound from left to right at the same angle as the underlying filaments 95. The filaments 95 and 96 may be bonded at their cross-over points 97 by an appropriate elastomeric binder material.

Rolls 10 and 12 are prepared by winding the filamentary material in a predetermined pattern on the rigid shaft 35. Each successive winding does not fall directly on the underlying parallel filament in the same layer; rather it is displaced to provide necessary void spaces which enable compression of the composite material. In one embodiment, the filament winding is started at one end of the roll and is wound with a gradual and continuous change in wrap angle beginning with a maximum angle at the roll end and reaching a minimum value at the roll center. The angle is then gradually increased to reach the maximum value again at the opposite roll end. The winding direction is then reversed and winding continues in the same manner back across the roll to create a criss-cross pattern with respect to the underlying layer. When the starting point is reached, the direction is again reversed, and this procedure is continued until the desired number of windings is achieved to create a roll of the desired diameter.

As an alternative to gradual and continuous change in the wrap angle along the length of the roll, it would be possible to create regions along the roll within which wrap angle is uniform, the wrap angle changing incrementally between these regions. Of couse, this will result in a completed roll in which force applied along the nip is not strictly uniform, but which may be sufficiently close to uniformity to function properly as a developer roll.

Other materials can be appropriate for use with the present invention, so long as such materials can be formed with the necessary variation in modulus of elasticity.

In the pressure roll of the present invention, the variation in wrap angle causes the stiffness of the material to vary locally. When two similarly-constructed rolls are symmetrically loaded to be pushed together by a force applied at each end of the shaft of each roll, symmetry requires that the roll nip be straight, while each shaft would bend internally with respect to the roll shell. A uniform pressure force along the length of the nip would be produced.

In some instances, it may be desirable to produce a curved nip. It has been found that a curved nip can be helpful, for example, in centering sheet material, particularly if the material is in web form. Such a design can be accommodated by the teachings of the present invention, simply by appropriately varying the wrap angle of the composite material forming the roll body.

While the form of apparatus herein described constitutes a preferred embodiment of this invention, it is to be understood that the invention is not limited to this precise form of apparatus, and that changes may be made therein without departing from the scope of the invention which is defined in the appended claims.

What is claimed is:

1. A pressure roll comprising:
   a support shaft;
   a cylindrical roll body secured to said shaft, having a length and defining a center point on said roll body and first and second ends spaced equidistantly in opposite directions from said center point;
   said roll body being formed from a body material having a modular of elasticity which varies as a function of position along the length of said roll body;
   said body material being formed from graphite filaments woven to have a predetermined wrap angle, the modulus of elasticity of said body material being a function of said wrap angle.

2. The pressure roll as defined in claim 1, wherein said roll body is encased in a cylindrical shell.

3. The pressure roll as defined in claim 2, wherein said shell is formed from a hardened metallic material.

4. The pressure roll as defined in claim 1, wherein the modulus of elasticity of said body material varies from a minimum value at said first and second ends of said roll body to a maximum value at said center of said roll body.

5. A roll type pressure fixing and developing apparatus in which sheet material to be treated is passed through a high pressure nip defined by a pair of rolls carried in a frame means, comprising:
   a first roll and a second roll, each of said rolls including
   a support shaft;
   a cylindrical roll body secured to said shaft, having a length and defining a center point on said roll body and first and second ends spaced equidistantly in opposite directions from said center point;
   said roll body being formed from a body material having a modulus of elasticity which varies as a function of position along the length of said body;
   said body material being formed from graphite filaments woven to have a predetermined wrap angle, the modulus of elasticity of said body material being a function of said wrap angle;
   said frame means mounting said first roll for pressure engagement with said second roll for defining said nip;
   said frame means further including loading means for applying load to said shaft of said first roll.

* * * * *

UNITED STATES PATENT AND TRADEMARK OFFICE
CERTIFICATE OF CORRECTION

PATENT NO. : 4,864,343

DATED : September 5, 1989

INVENTOR(S) : Erik K. Nelson

It is certified that error appears in the above-identified patent and that said Letters Patent is hereby corrected as shown below:

Column 8, line 17, "modular" should read -- modulus --.

Signed and Sealed this

Eleventh Day of December, 1990

Attest:

HARRY F. MANBECK, JR.

*Attesting Officer*  *Commissioner of Patents and Trademarks*